United States Patent
Seki

(10) Patent No.: US 11,862,430 B2
(45) Date of Patent: Jan. 2, 2024

(54) PATTERN FORMATION METHOD AND TEMPLATE MANUFACTURING METHOD

(71) Applicant: KIOXIA CORPORATION, Tokyo (JP)

(72) Inventor: Ryota Seki, Kawasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 324 days.

(21) Appl. No.: 17/392,571

(22) Filed: Aug. 3, 2021

(65) Prior Publication Data

US 2022/0051871 A1 Feb. 17, 2022

(30) Foreign Application Priority Data

Aug. 12, 2020 (JP) .................................. 2020-136342

(51) Int. Cl.
  *G03F 7/00* (2006.01)
  *B29C 33/38* (2006.01)
  *H01J 37/317* (2006.01)

(52) U.S. Cl.
  CPC ...... *H01J 37/3175* (2013.01); *B29C 33/3842* (2013.01); *G03F 7/0002* (2013.01); *H01J 2237/31777* (2013.01)

(58) Field of Classification Search
  None
  See application file for complete search history.

(56) References Cited

U.S. PATENT DOCUMENTS

| 7,604,926 | B2 | 10/2009 | Kamigaki et al. | |
| 9,623,439 | B2* | 4/2017 | Ito | B82Y 40/00 |
| 10,115,726 | B2 | 10/2018 | Kang et al. | |
| 10,366,888 | B2* | 7/2019 | Yamada | H01L 21/0273 |
| 2006/0076509 | A1* | 4/2006 | Okino | G11B 5/743 |
| 2019/0383770 | A1* | 12/2019 | Choi | G01N 27/4145 |
| 2020/0089105 | A1* | 3/2020 | Sakurai | G03F 7/405 |

FOREIGN PATENT DOCUMENTS

| JP | 2013-77776 A | * | 4/2013 |
| JP | 2014053535 A | | 3/2014 |
| JP | 2015115524 A | | 6/2015 |
| JP | 2019008071 A | | 1/2019 |
| JP | 2019508889 A | | 3/2019 |

OTHER PUBLICATIONS

Machine English translation of JP 2013-77776A; (Year: 2013).*

* cited by examiner

*Primary Examiner* — Shamim Ahmed
(74) *Attorney, Agent, or Firm* — Kim & Stewart LLP

(57) ABSTRACT

According to one embodiment, a pattern formation method includes placing an imprint resist film on a substrate, then imprinting a pattern in the imprint resist film. The pattern has a first loop section in a first end portion and a second loop section in a second end portion. After the imprint resist film has been patterned, it is selectively irradiated between the first loop section and the second loop section. The imprint resist film is then etched under conditions leaving the selectively irradiated portion of the imprint resist film and removing the unirradiated portion of the imprint resist film.

20 Claims, 6 Drawing Sheets

CROSS SECTION TAKEN ALONG A-A'

CROSS SECTION TAKEN ALONG A-A'

CROSS SECTION TAKEN ALONG A-A'

CROSS SECTION TAKEN ALONG A-A'

CROSS SECTION TAKEN ALONG A-A'

PATTERN FORMATION METHOD AND TEMPLATE MANUFACTURING METHOD

CROSS-REFERENCE TO RELATED APPLICATION

This application is based upon and claims the benefit of priority from Japanese Patent Application No. 2020-136342, filed Aug. 12, 2020, the entire contents of which are incorporated herein by reference.

FIELD

Embodiments described herein relate generally to an imprint lithography pattern formation method and an imprint template manufacturing method.

BACKGROUND

A technique of using a side wall transfer process for manufacturing a template to be used in an imprint lithography method is known.

DETAILED DESCRIPTION

Figure 1A:
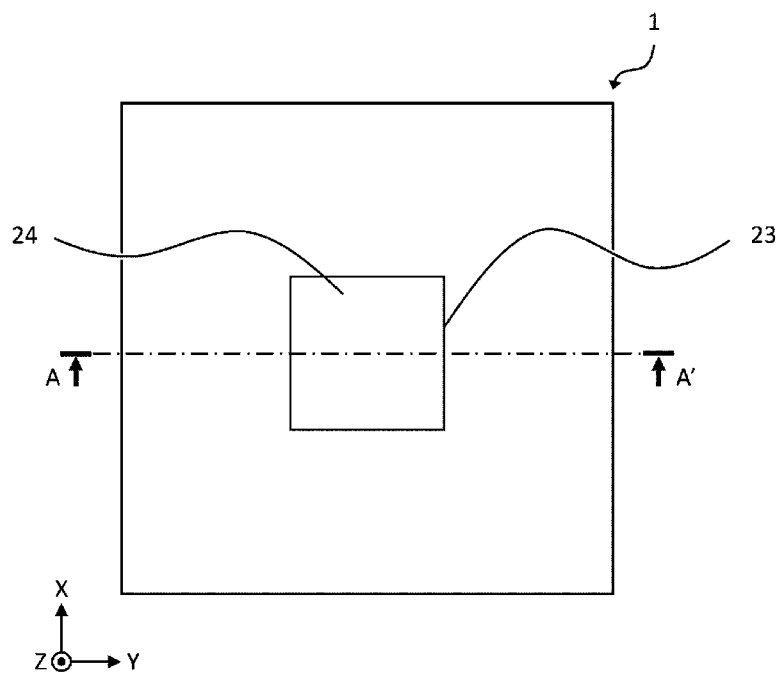
FIGS. 1A and 1B show aspects of a template according to an embodiment.

Example embodiments provide a pattern formation method and a template manufacturing method for facilitating formation of a line-and-space pattern using a side wall transfer process.

In general, according to one embodiment, a pattern formation method placing an imprint resist film on a substrate, then imprinting a pattern in the imprint resist film. The pattern has a first loop section in a first end portion and a second loop section in a second end portion corresponding to, for example, a side wall pattern doubling transfer process. The patterned imprint resist film is then selectively irradiated in a portion between the first loop section and the second loop section. The imprint resist film is then etched under conditions leaving the selectively irradiated portion of the imprint resist film and removing the unirradiated portion of the imprint resist.

Certain example embodiments of the present disclosure will be described with reference to the accompanying drawings. In the drawings, the same or substantially similar aspects are denoted by same reference symbols. However, the drawings are schematic and depicted relationships between thicknesses and plane dimensions and the like generally differ from actual relationships.

Figure 1B:
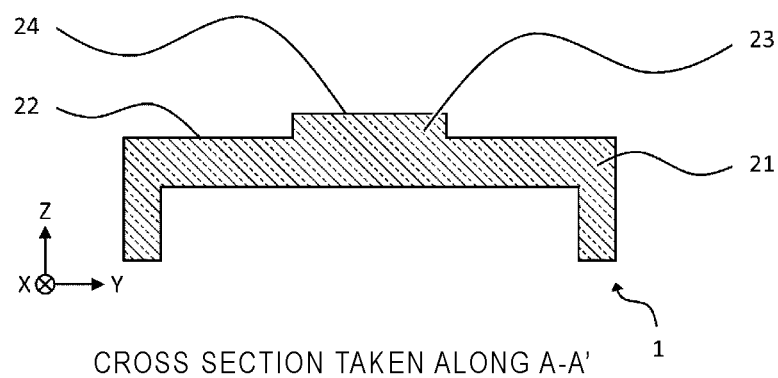

A template according to an embodiment will first be described with reference to FIGS. 1A and 1B. FIG. 1A is a plan view of a template 1 viewed from a Z direction. FIG. 1B is a cross-sectional view of the template 1 taken along AA' of FIG. 1A and viewed from an X direction. The template 1 has a substrate 21 that has a quadrilateral shape in a view from the Z direction. In a case of nanoimprint lithography using photo-curing, the template 1 comprises, for example, quartz or other transparent material.

A mesa structure 23 projecting from a principal surface 22 of the substrate 21 is provided at a center of the principal surface 22. The mesa structure 23 has a pattern surface 24 on an upward facing surface thereof. A recess structure (topographic) pattern incorporating a transfer pattern (the pattern to be transferred in the imprint lithography process) and an alignment mark is formed on the pattern surface 24.

The transfer pattern formed on the pattern surface 24 includes a fine line-and-space pattern at, several tens of nanometer (nm) half pitch (hp). Such a fine pattern is generally difficult to directly form by exposing the corresponding pattern in a photoresist using photolithography or the like in a single exposure step and thus more complicated methods are often adopted.

Figure 4A:
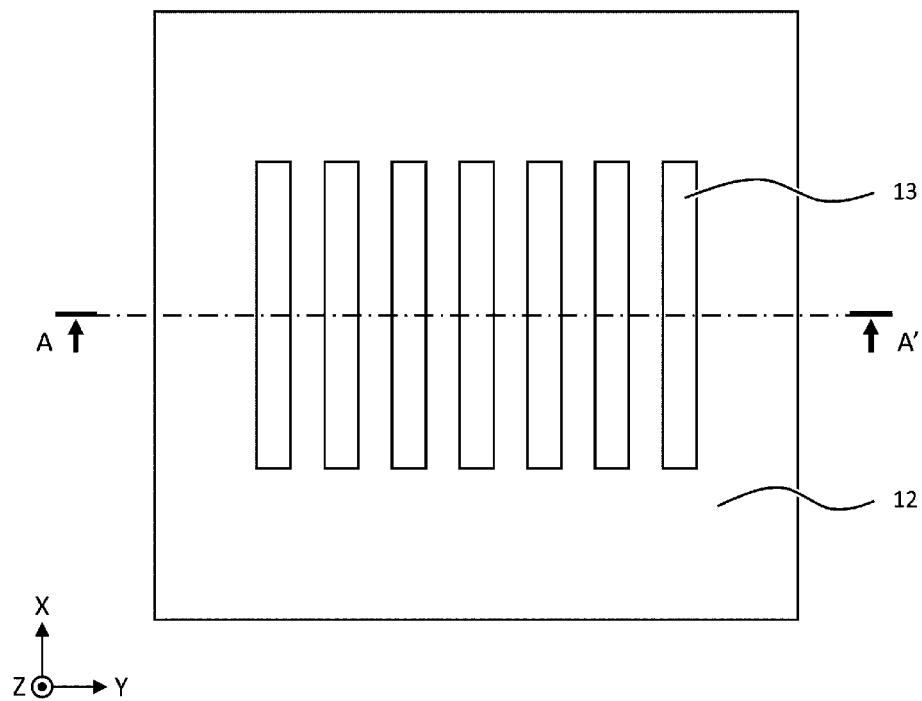
FIGS. 4A and 4B show aspects of a pattern formation method according to an embodiment.
Figure 4B:
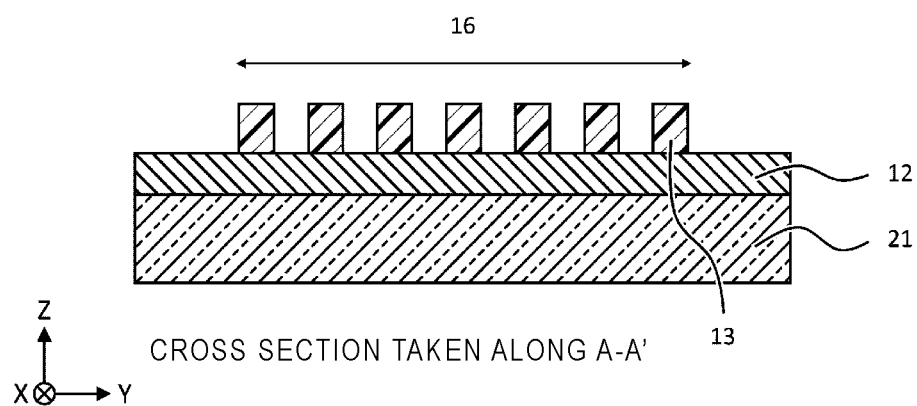
Figure 5A:
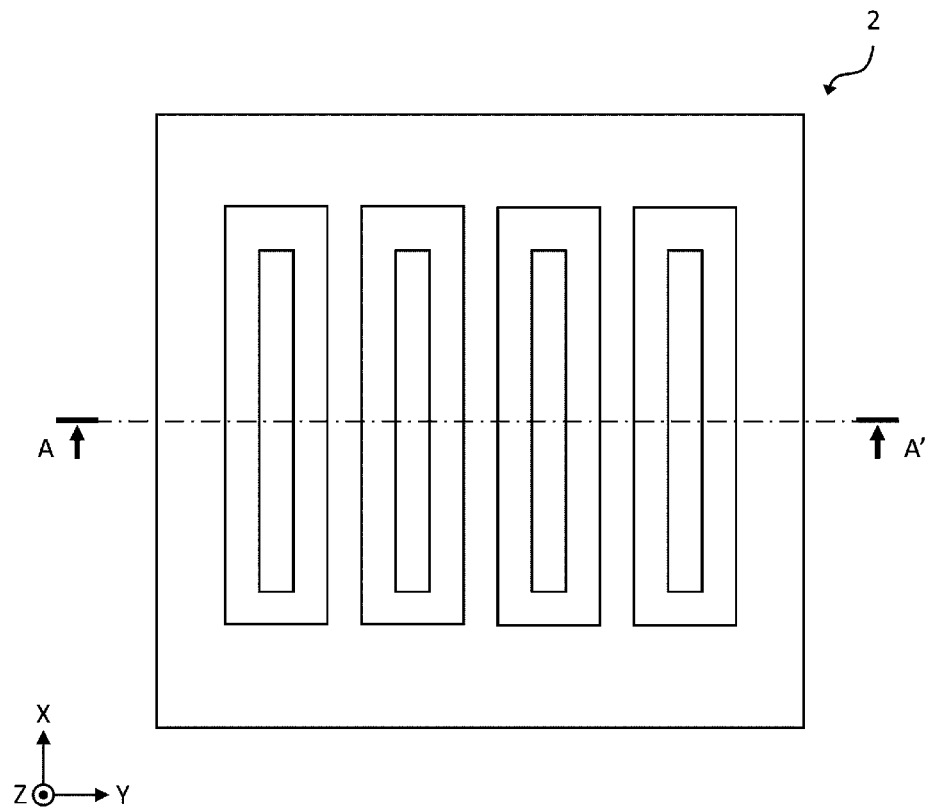
FIGS. 5A and 5B show an example of a mold-like template used in a pattern formation method according to an embodiment.
Figure 5B:
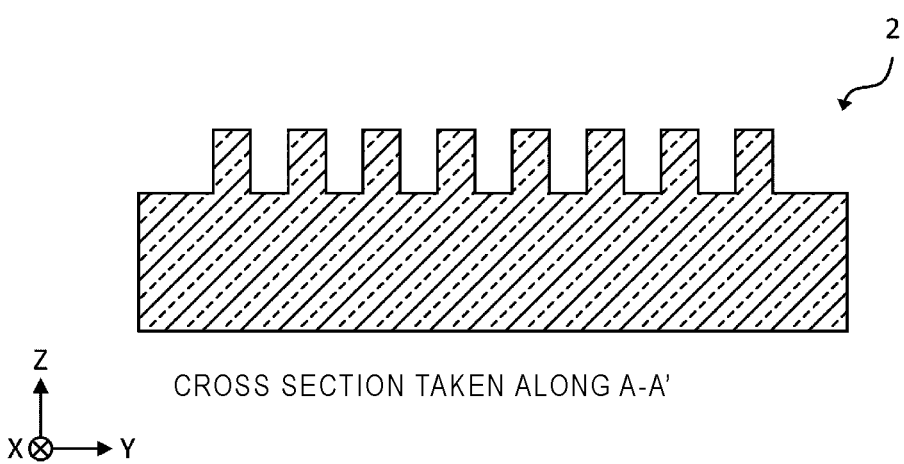

A template manufacturing method according to the present disclosure will be described with reference to FIGS. 2A to 6D. FIGS. 2A to 4B show aspects of a pattern formation method according to an embodiment. FIGS. 5A and 5B depict an example of a mold template used in the embodiment. FIGS. 2A, 3A, 4A, and 5A are plan views viewed from the Z direction. FIGS. 2B, 3B, 4B, and 5B are cross-sectional views taken along AA' of FIGS. 2A, 3A, 4A, and 5A and viewed from the X direction. FIGS. 6A to 6D show aspects of the template manufacturing method according to the present disclosure.

Figure 2A:
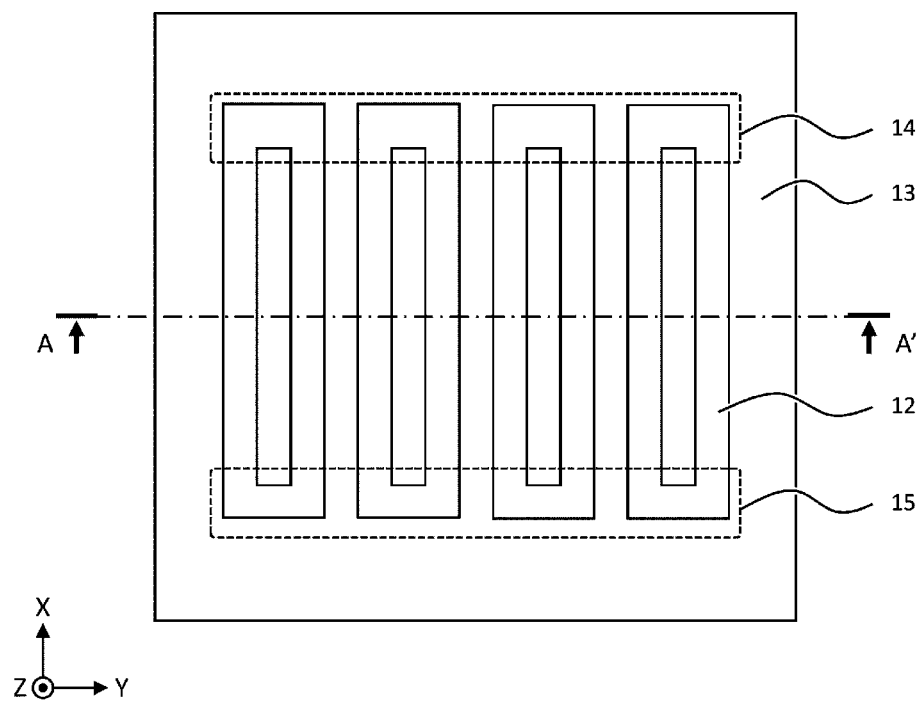
FIGS. 2A and 2B show aspects of a pattern formation method according to an embodiment.

As depicted in FIG. 2A, a hard mask film 12 is first formed on the substrate 21. The substrate 21 comprises, for example, quartz. The hard mask film 12 comprises, for example, chromium.

Next, a resist film 13 is formed on the hard mask film 12. The resist film 13 may be formed, for example, by coating a resist material on the hard mask film 12 using a spin coating method and then baking the resist. Examples of the resist material include an ultraviolet curable resist.

Next, a pattern is transferred into the resist. In the present embodiment, a mold template 2 (shown in FIGS. 5A and 5B), with a pattern having a raised loop structure that may be formed by a side wall transfer process or the like can be used. The mold template 2 comprises, for example, quartz (or other transparent material) in the case of the nanoimprint lithography using photo-curing. In this context, a side wall transfer process as used herein refers to a process of forming a resist pattern by lithography, subsequently forming another film on the resist pattern, performing etching to form a pattern on a side wall of the resist pattern, and then transferring the formed pattern into a hard mask film. Using the side wall transfer process makes it possible to form a fine line-and-space shape although a loop structure is initially present. The side wall transfer process may also be referred to in some instances as side wall pattern doubling process or the like.

Figure 2B:
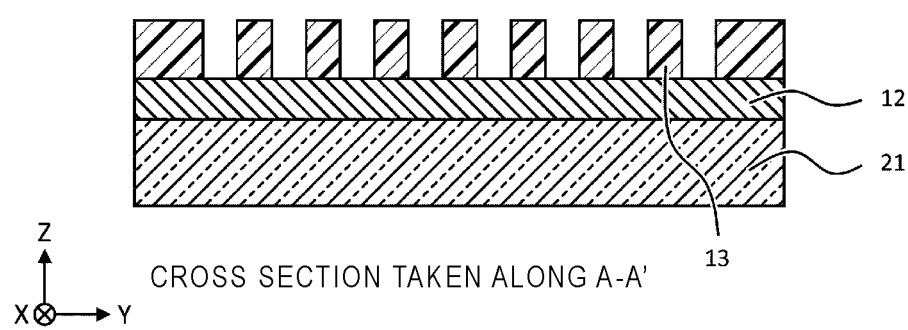

In this present example, an imprint process using the mold template 2 is performed to pattern the resist film 13, and the pattern having a recessed loop structure as shown in FIGS. 2A and 2B is thereby formed in the resist film 2. As shown in FIG. 2A, the formed pattern has a first loop section 14 at a first end portion and a second loop section 15 at a second end portion. The pattern has line parts that are present between the first loop section 14 and the second loop section 15. The line parts couple the first loop section 14 to the second loop section 15, and that extend in the X direction.

Figure 3A:
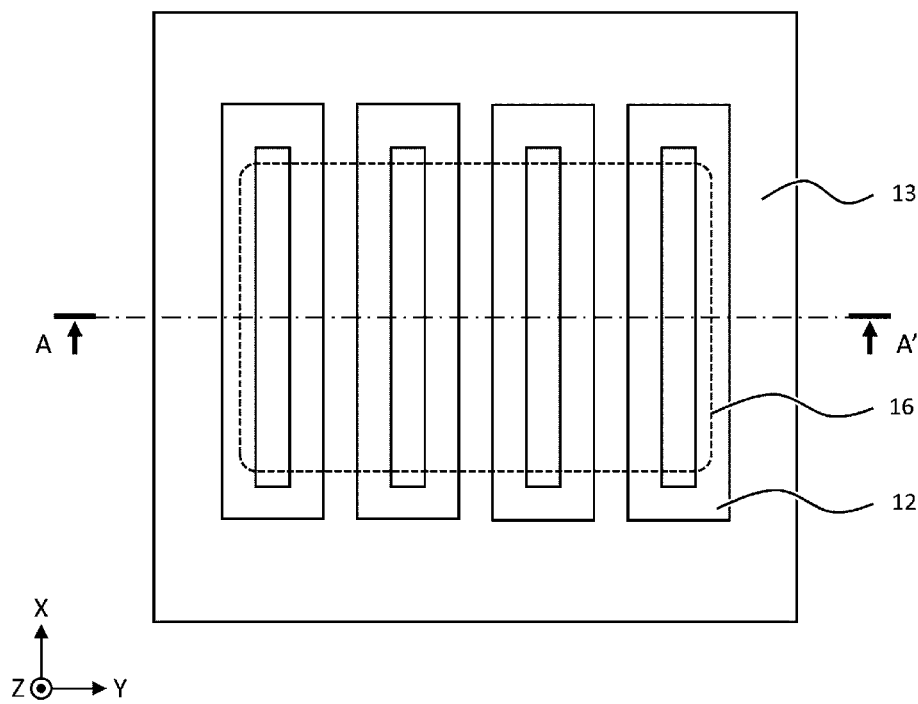
FIGS. 3A and 3B show aspects of a pattern formation method according to an embodiment.
Figure 3B:
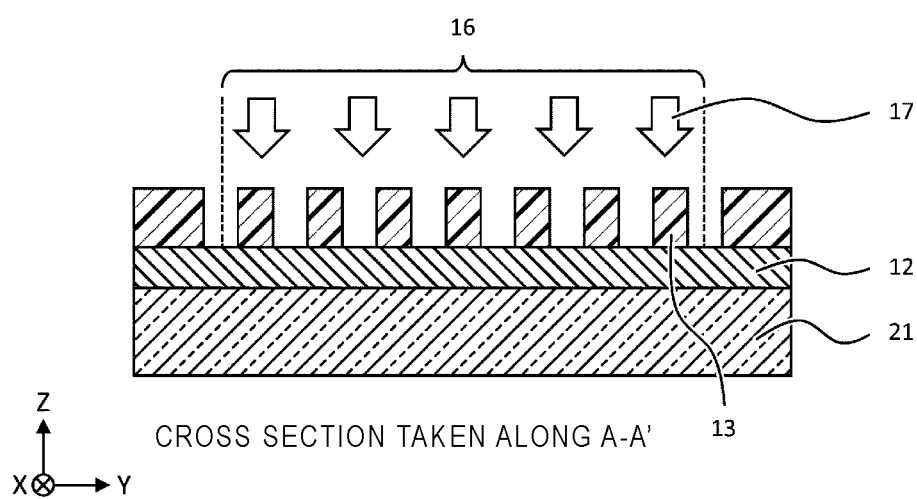

Next, as shown in FIG. 3B, radiation 17 is applied to the resist film 13 within a region 16 between the first loop section 14 and the second loop section 15. The radiation 17 is, for example, an electron beam. The electron beam can be applied to the resist film 13 at an acceleration voltage of 0.7 kV and a total amount of irradiation is 2038.4 µC/cm$^2$. It is noted that the region 16 is not necessarily limited to the region shown in FIGS. 3A and 3B and may be set to any desired location between the first loop section 14 and the second loop section 15. Furthermore, the region 16 may include interconnections features, circuit element patterns, an alignment mark, and the like formed in the resist film 13 in regions outside the first loop section 14 and the second loop section 15.

Applying the radiation 17 to the resist film 13 provides a reduction in free volume of the resist film 13, and an improvement in etch resistance of the resist film 13 as compared with a resist film 13 to which the radiation 17 is not applied.

Next, the resist film 13 is etched. At this time, since the resist film 13 in the region 16 has improved etch resistance due to application of the radiation 17, the resist film 13 in the region 16 can remain while the resist film 13 outside of the region 16 is removed, as shown in FIGS. 4A and 4B. In this way, a desired mask pattern 28 (see FIG. 6A) from which the first loop section 14 and the second loop section 15 are removed can be formed. It is, therefore, possible to form a line-and-space pattern without the loop shape in the end portions.

Figure 6A:
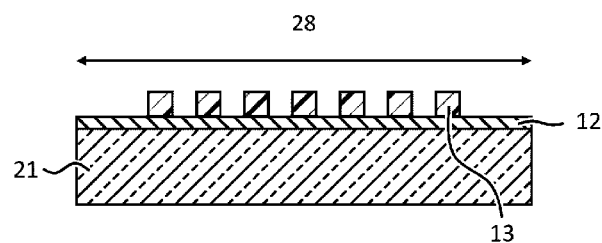
FIGS. 6A to 6D show aspects of a template manufacturing method according to an embodiment.

FIG. 6A shows a state after the etching shown in FIGS. 4A and 4B.

Figure 6B:
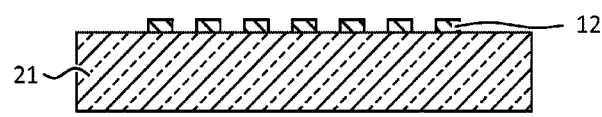

Next, as shown in FIG. 6B, the hard mask film 12 is etched using the mask pattern 28 formed of the resist film 13 as a mask. The mask pattern 28 is thereby transferred into the hard mask film 12.

Figure 6C:
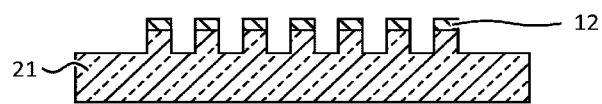

Next, as shown in FIG. 6C, the substrate 21 is etched using the now-patterned hard mask film 12 as a mask.

Figure 6D:
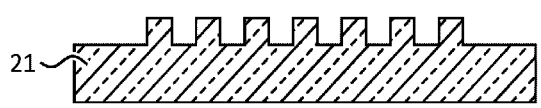

Next, as shown in FIG. 6D, the hard mask film 12 is removed (stripped). The hard mask film 12 can be removed by wet etching or dry etching. In this way, the template 1 according to the present embodiment is manufactured.

The template manufacturing method according to the present embodiment is capable of facilitating forming the desired mask pattern 28 from which the first loop section 14 and the second loop section 15 have been removed by applying the radiation 17 to the resist film 13 in the region 16. In addition, the template manufacturing method according to the present embodiment is capable of achieving a reduction in the number of processes because there is no need to provide a mask for removing the first loop section 14 and the second loop section 15. Additionally, the template manufacturing method according to the present embodiment is capable of achieving an improvement in yield because of the reduction in the number of processes such as forming and removing the mask for loop section removal or the like.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A pattern formation method, comprising:
   placing an imprint resist film on a substrate;
   imprinting a pattern in the imprint resist film, the pattern having a first loop section in a first end portion and a second loop section in a second end portion;
   selectively irradiating the patterned imprint resist film between the first loop section and the second loop section; and
   etching the imprint resist film under conditions leaving the selectively irradiated portion of the imprint resist film and removing the unirradiated portion of the imprint resist film.

2. The pattern formation method according to claim 1, wherein the selective irradiation is performed with an electron beam.

3. The pattern formation method according to claim 1, wherein a region of the imprint resist film corresponding to an alignment mark is also selectively irradiating before the etching.

4. The pattern formation method according to claim 1, wherein the pattern is formed on an imprint template by a side wall transfer process.

5. The pattern formation method according to claim 1, wherein the substrate is quartz.

6. The pattern formation method according to claim 1, wherein the substrate is an imprint template including a mesa structure.

7. The pattern formation method according to claim 1, further comprising:
   after the etching of the imprint resist film, etching a hard mask layer on the substrate using the etched imprint resist film as a mask.

8. The pattern formation method according to claim 7, further comprising:
   after the etching of the hard mask layer, etching the substrate using the etched hard mask layer as a mask.

9. A patterning method, comprising:
   obtaining a first imprint template including a line and space pattern formed by a side wall transfer process, the line and space pattern including a first loop end portion at one end and a second loop end portion at another end;
   performing an imprint lithography process on a substrate using the first imprint template to transfer the line and space pattern to an imprint resist on the substrate;
   after the imprint lithography process, radiation hardening a portion of the imprint resist between the first loop end portion and the second loop end portion;
   etching the imprint resist to remove the portions of the imprint resist that were not radiation hardened and leave the portions of the imprint resist that were radiation hardened; and
   etching the substrate using the remaining portions of the radiation hardened imprint resist as a mask.

10. The patterning method according to claim 9, wherein the radiation hardening is performed with an electron beam.

11. The patterning method according to claim 9, wherein a region of the imprint resist corresponding to an alignment mark is also radiation hardened.

12. The patterning method according to claim 9, wherein the substrate is quartz.

13. The patterning method according to claim 9, wherein the substrate is a second imprint template including a mesa structure.

14. The patterning method according to claim 9, wherein etching the substrate comprises etching a hard mask layer on the substrate using the previously etched imprint resist as a mask.

15. The patterning method according to claim 14, wherein
the substrate is quartz, and
the hard mask comprises chrome.

16. A template manufacturing method, comprising:
forming a hard mask film on a substrate;
forming a resist film on the hard mask film;
patterning the resist film to have a pattern including a first loop section in a first end portion of a line-space pattern and a second loop section in a second end portion of the line-space pattern;
irradiating the resist between the first loop section and the second loop section;
removing the portions of the resist not irradiated; and
etching the mask film and the substrate using the remaining resist film.

17. The template manufacturing method according to claim 16, wherein the irradiating is with an electron beam.

18. The template manufacturing method according to claim 16, wherein a region in the resist film corresponding to an alignment mark formed in the resist film is also irradiated.

19. The template manufacturing method according to claim 16, wherein the substrate is quartz.

20. The template manufacturing method according to claim 16, wherein the patterning of the resist film is performed by imprint lithography.

* * * * *